(12) United States Patent
Han et al.

(10) Patent No.: US 12,269,269 B2
(45) Date of Patent: *Apr. 8, 2025

(54) INKJET PRINTING APPARATUS AND METHOD OF MANUFACTURING DISPLAY DEVICE USING THE SAME

(71) Applicant: SAMSUNG DISPLAY CO., LTD., Yongin-si (KR)

(72) Inventors: Jeong Won Han, Seongnam-si (KR); Myung Soo Huh, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/353,819

(22) Filed: Jul. 17, 2023

(65) Prior Publication Data

US 2023/0356529 A1  Nov. 9, 2023

Related U.S. Application Data

(62) Division of application No. 17/213,076, filed on Mar. 25, 2021, now Pat. No. 11,707,932.

(30) Foreign Application Priority Data

Jul. 22, 2020  (KR) ........................ 10-2020-0090859

(51) Int. Cl.
*B41J 2/17* (2006.01)
*B05B 15/52* (2018.01)
(Continued)

(52) U.S. Cl.
CPC ............. *B41J 2/1707* (2013.01); *B05B 15/52* (2018.02); *B41J 2/17513* (2013.01); *H10K 71/13* (2023.02)

(58) Field of Classification Search
CPC ............ H10K 71/73; B41J 2002/14403; B41J 2/17563; B41J 2/17596; B41J 2/211;
(Continued)

(56) References Cited

U.S. PATENT DOCUMENTS 5,527,460 A * 6/1996 Trampler ................. B01J 19/10
  210/198.1
2008/0284820 A1* 11/2008 Pan ......................... B41J 2/1631
  347/46

(Continued)

FOREIGN PATENT DOCUMENTS

JP   2007090280     *   4/2007
JP   2007090280 A      4/2007

(Continued)

*Primary Examiner* — Nathan T Leong
(74) *Attorney, Agent, or Firm* — Womble Bond Dickinson (US) LLP

(57) ABSTRACT

An inkjet printing apparatus includes a surface acoustic wave module including an inner passage and a surface acoustic wave generator around the inner passage; and an outflow passage connected to the surface acoustic wave module to discharge ink, where the outflow passage includes a first outflow passage connected to the inner passage to discharge first ink particles and a second outflow passage connected to the inner passage to discharge second ink particles having an average diameter smaller than that of the first ink particles, and the surface acoustic wave generator is closer to the second outflow passage than the first outflow passage.

6 Claims, 17 Drawing Sheets

(51) Int. Cl.
*B41J 2/175* (2006.01)
*H10K 71/13* (2023.01)

(58) Field of Classification Search
CPC ... B41J 2/14008; B41J 2/04575; B01D 17/00; B01D 17/12; B01D 43/00; B01J 19/08; B01J 19/10
See application file for complete search history.

(56) References Cited

U.S. PATENT DOCUMENTS

2010/0126922 A1   5/2010   Takahashi et al.
2012/0162309 A1   6/2012   Paschkewitz et al.

FOREIGN PATENT DOCUMENTS

| JP | 5496800 B2 | | 5/2014 |
| KR | 10-2012-0060682 A | | 6/2012 |
| KR | 10-2012-0138703 A | | 12/2012 |
| KR | 1020170100314 | * | 2/2016 |
| KR | 10-2017-0041682 A | | 4/2017 |
| KR | 10-2017-0100314 A | | 9/2017 |

* cited by examiner

FIG. 7

```
Start
  ↓
Introducing ink base material and ink having      ─S10
ink particles into inner passage, respectively
  ↓
Separating first ink particles from second ink    ─S20
particles based on first particle diameter
  ↓
Spraying ink mixture of separated second ink      ─S30
particles and ink base material onto substrate
  ↓
End
```

INKJET PRINTING APPARATUS AND METHOD OF MANUFACTURING DISPLAY DEVICE USING THE SAME

CROSS-REFERENCE TO RELATED APPLICATIONS

This application is a divisional of U.S. patent application Ser. No. 17/213,076, filed Mar. 25, 2021, which claims priority to and the benefit of Korean Patent Application No. 10-2020-0090859, filed Jul. 22, 2020, the entire content of both of which is incorporated herein by reference.

BACKGROUND

1. Field

The present disclosure relates to an inkjet printing apparatus and a method of manufacturing a display device using the same.

2. Description of Related Art

An inkjet printing apparatus includes an ink cartridge for storing ink and a solvent in which the ink is dispersed, a filter for filtering large ink particles from the ink cartridge, and an inkjet head for spraying the filtered ink particles onto a printing target object.

As the usage period of the filter increases, the ink particles filtered by the filter cause a pressure drop between the ink cartridge and the inkjet head, which may bring about the necessity of periodic replacement of the filter. This leads to cost increase and productivity reduction. Furthermore, the ink particles as wastes filtered by the filter may cause environmental pollution.

SUMMARY

Aspects of one or more embodiments of the present disclosure are directed towards an inkjet printing apparatus that is capable of separating ink particles having a large particle diameter without using a filter.

Aspects of one or more embodiments of the present disclosure are directed towards a method of manufacturing a display device that is capable of separating ink particles having a large particle diameter without using a filter.

However, aspects of the one or more embodiments of the present disclosure are not restricted to those set forth herein. The above and other aspects of the present disclosure will become more apparent to one of ordinary skill in the art to which the present disclosure pertains by referencing the detailed description of the present disclosure given below.

According to an embodiment, an inkjet printing apparatus includes a surface acoustic wave module including an inner passage and a surface acoustic wave generator around the inner passage; and an outflow passage connected to the surface acoustic wave module to discharge ink. The outflow passage may include a first outflow passage connected to the inner passage to discharge first ink particles and a second outflow passage connected to the inner passage to discharge second ink particles having an average diameter smaller than that of the first ink particles. The surface acoustic wave generator may be closer to the second outflow passage than the first outflow passage.

The inkjet printing apparatus may further include a waste ink collection module connected to the first outflow passage to receive the first ink particles, and an inkjet head unit connected to the second outflow passage to receive the second ink particles.

The inkjet printing apparatus may further include a first inflow passage and a second inflow passage connected to the inner passage. An ink base material may be introduced through the first inflow passage. The ink may be introduced through the second inflow passage. The surface acoustic wave generator may be closer to the second inflow passage than the first inflow passage.

A sum of a width of the first inflow passage and a width of the second inflow passage may be substantially equal to a width of the inner passage.

The inkjet printing apparatus may further include a base material storage unit connected to the first inflow passage, the base material storage unit being to store the ink base material, and an ink storage unit connected to the second inflow passage, the ink storage unit being to store the ink.

The inkjet printing apparatus may further include a connection passage connecting the inkjet head unit to the ink storage unit.

The inkjet head unit may be operably movable relative to the surface acoustic wave module. The second outflow passage and the connection passage may each be made of a more flexible material than that of the first outflow passage.

The inkjet printing apparatus may further include a first filter module connected to the second outflow passage. The second outflow passage may include a $(2a)^{th}$ outflow passage connecting the surface acoustic wave module to the first filter module, and a $(2b)^{th}$ outflow passage connecting the first filter module to the inkjet head unit. The first filter module may filter ink particles introduced through the $(2a)^{th}$ outflow passage.

The inkjet printing apparatus may further include a connection passage connecting the waste ink collection module to the base material storage unit, and a second filter module connected to the connection passage. The connection passage may include a $(2a)^{th}$ connection passage connecting the waste ink collection module to the second filter module, and a $(2b)^{th}$ connection passage connecting the second filter module to the base material storage unit. The second filter module is to filter ink particles introduced through the $(2a)^{th}$ connection passage.

The first filter module may include a plurality of first filters spaced from each other. The second filter module may include a plurality of second filters spaced from each other. A separation distance between the first filters adjacent to each other is smaller than a separation distance of the second filters adjacent to each other.

The inkjet printing apparatus may further include a plurality of surface acoustic wave generators including the surface acoustic wave generator.

The surface acoustic wave generator may include a piezo substrate and electrodes on the piezo substrate. The electrodes may include first and second electrodes alternately arranged along a direction.

The inkjet printing apparatus may further include an ink mixture storage unit connected to the second outflow passage.

According to another embodiment, a method of manufacturing a display device includes introducing an ink base material and ink including first ink particles and second ink particles into an inner passage; separating the first ink particles having an average particle diameter equal to or greater than a first particle diameter from the second ink particles having an average particle diameter smaller than the first particle diameter based on the first particle diameter using a surface acoustic wave; and spraying an ink mixture of the separated second ink particles and the ink base material onto a substrate.

The introducing the ink base material and the ink into the inner passage may include introducing the ink base material and the ink into the inner passage through respective inflow passages.

The separating the first ink particles and the second ink particles using the surface acoustic wave may include forming the surface acoustic wave using a surface acoustic wave generator, the surface acoustic wave generator being closer to the inflow passage of the ink than the inflow passage of the ink base material.

The separating the first ink particles and the second ink particles using the surface acoustic wave may include separating the first ink particles from the second ink particles by adjusting a wavelength and an intensity of the surface acoustic wave.

The first ink particles may be separated from the second ink particles based on the first particle diameter of about 2 μm using the surface acoustic wave having the wavelength of about 25 μm or less and the intensity of about 10 dBm or more.

The first ink particles may be separated from the second ink particles based on the first particle diameter of about 3 μm using the surface acoustic wave having the wavelength of about 28 μm or less and the intensity of about 2.5 dBm or more.

The ink base material may include a base resin. The ink may include wavelength shifters.

According to embodiments of the present disclosure, it is possible to separate ink particles having a large particle diameter without using a filter.

The effects of the present disclosure are not limited to the aforementioned effects, and various other effects are included in the present specification.

BRIEF DESCRIPTION OF THE DRAWINGS

The above and other aspects and features of the present disclosure will become more apparent by describing in more detail embodiments thereof with reference to the attached drawings, in which:

FIG. 7 is a flowchart illustrating a method of manufacturing a display device according to an embodiment;

DETAILED DESCRIPTION

Figure 1:
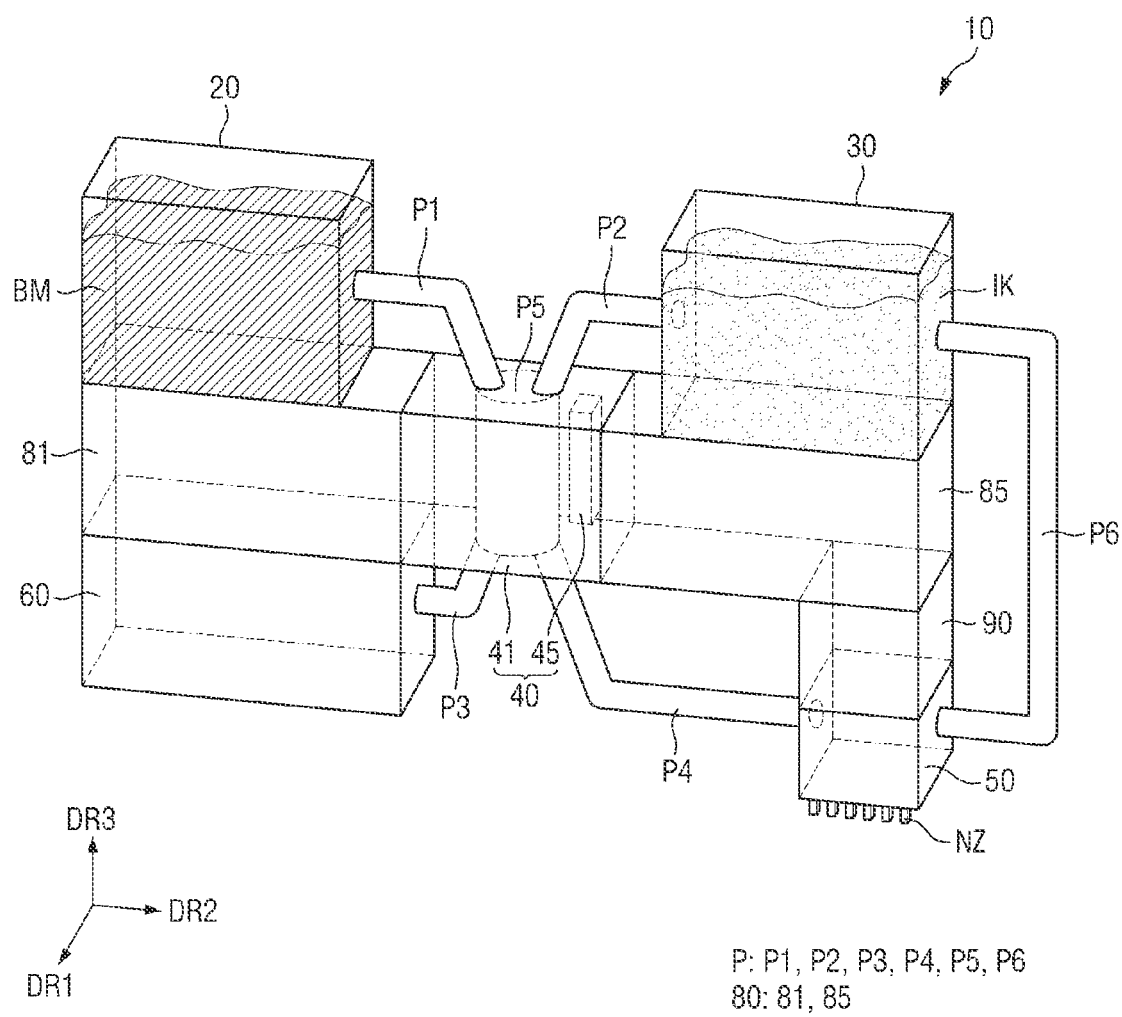
FIG. 1 is a perspective view of an inkjet printing apparatus according to an embodiment.

Specific structural and functional descriptions of embodiments of the present disclosure disclosed herein are only for illustrative purposes of the embodiments of the present disclosure. The present disclosure may be embodied in many different forms without departing from the spirit and significant characteristics of the present disclosure. Therefore, the embodiments of the present disclosure are disclosed only for illustrative purposes and should not be construed as limiting the present disclosure. It will be understood that when an element is referred to as being related to another element such as being "coupled" or "connected" to another element, it can be directly coupled or connected to the other element or intervening elements may be present therebetween. In contrast, it should be understood that when an element is referred to as being related to another element such as being "directly coupled" or "directly connected" to another element, there are no intervening elements present. Other expressions that explain the relationship between elements, such as "between," "directly between," "adjacent to," or "directly adjacent to," should be construed in the same way.

Throughout the specification, the same reference numerals will refer to the same or like parts.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" refers to "at least one element," unless the context clearly indicates otherwise. "At least one" is not to be construed as limiting "a" or "an." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, acts, operations, elements, and/or components, but do not preclude the presence or addition of one or more other features, regions, integers, steps, acts, operations, elements, components, and/or groups thereof.

Furthermore, relative terms, such as "lower" or "bottom" and "upper" or "top," may be used herein to describe one element's relationship to another element as illustrated in the drawings. It will be understood that relative terms are intended to encompass different orientations of the device in addition to the orientation depicted in the drawings. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and refers to within an acceptable range of deviation for the particular value as determined by one of ordinary skill in the art, considering the measurement in question and the error associated with measurement of the particular quantity (i.e., the limitations of the measurement system). For example, "about" can refer to within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

As used herein, the terms "use," "using," and "used" may be considered synonymous with the terms "utilize," "utilizing," and "utilized," respectively.

Further, the use of "may" when describing embodiments of the present disclosure refers to "one or more embodiments of the present disclosure".

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the present disclosure will be described in more detail with reference to the attached drawings.

Figure 2:
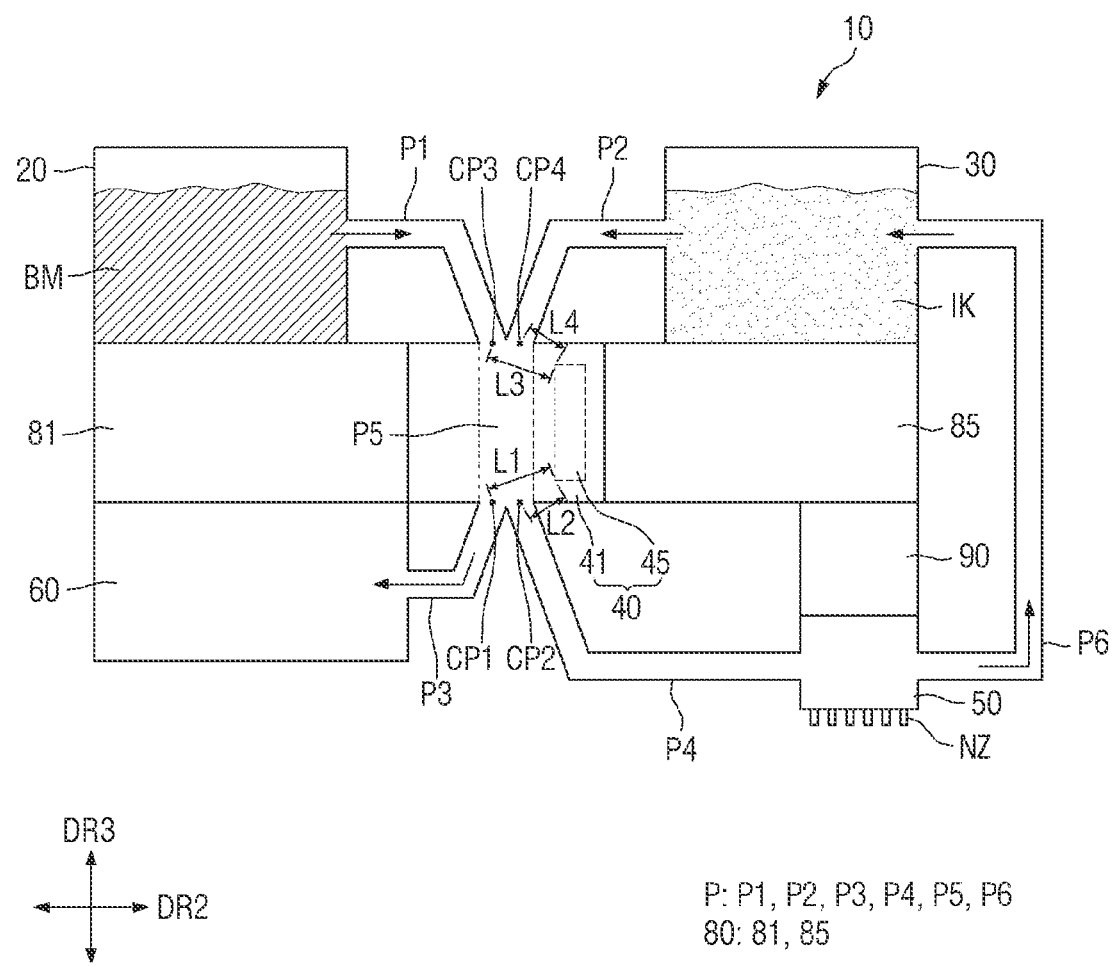
FIG. 2 is a cross-sectional view of an inkjet printing apparatus according to an embodiment.

FIG. 1 is a perspective view of an inkjet printing apparatus according to an embodiment. FIG. 2 is a cross-sectional view of an inkjet printing apparatus according to an embodiment.

Referring to FIGS. 1 and 2, an inkjet printing apparatus 10 according to an embodiment is an apparatus for spraying ink and an ink base material onto a printing target object in an inkjet printing manner. The printing target object may be, for example, a substrate of a display panel of a display device. Examples of the display panel may include an organic light emitting display panel, a micro LED display panel, a nano LED display panel, a quantum dot light emitting display panel, a liquid crystal display panel, a plasma display panel, a field emission display panel, an electrophoretic display panel, an electrowetting display panel, and/or the like. Although the following description is directed to the case where a quantum dot light emitting display panel is applied as a display panel, the present disclosure is not limited thereto, and other display panels may be applied without departing from the technical spirit of the present disclosure.

The inkjet printing apparatus 10 may include a base material storage unit 20, an ink storage unit 30, a surface acoustic wave module 40, a waste ink collection module 60, an inkjet head unit 50, a support member 80, a connection member 90, and a plurality of passages.

The plurality of passages may include a first inflow passage P1 connecting the base material storage unit 20 to the surface acoustic wave module 40, a second inflow passage P2 connecting the ink storage unit 30 to the surface acoustic wave module 40, a first outflow passage P3 connecting the surface acoustic wave module 40 to the waste ink collection module 60, a second outflow passage P4 connecting the surface acoustic wave module 40 to the inkjet head unit 50, an inner passage P5 included in the surface acoustic wave module 40 and connected at the top end thereof to the first and second inflow passages P1 and P2 in the thickness direction and at the bottom end thereof to the first and second outflow passages P3 and P4 in the thickness direction, and a first connection passage P6 connecting the inkjet head unit 50 to the ink storage unit 30. In one or more embodiments, the second inflow passage P2 and the first connection passage P6 may be connected to opposite ends of the ink storage unit 30, and the second outflow passage P4 and the first connection passage P6 may be connected to opposite ends of the inkjet head unit 50.

The base material storage unit 20 may be a storage unit that stores an ink base material BM. The ink storage unit 30 may store ink IK. The ink base material BM may be a polymer material or a solvent made of water. The ink IK may be a dispersion agent dispersed in the ink base material BM. The ink base material BM and the ink IK may include materials that suitably vary in kind depending on the structure formed on the substrate of the display panel by spraying in an inkjet printing manner.

For example, in the case where the structure formed on the substrate of the display panel is a wavelength conversion pattern, the wavelength conversion pattern may include a base resin and wavelength shifters dispersed in the base resin, and may further include scatterers dispersed in the base resin. Examples of the base resin may include an organic material such as an epoxy resin, an acrylic resin, and/or an imide resin, and examples of the wavelength shifter may include quantum dots, quantum rods, and/or phosphors. In this case, the ink base material BM may include a base resin, and the ink IK may include wavelength shifters and scatterers. In the case where the structure formed on the substrate of the display panel is a light transmission pattern, the ink IK may include scatterers.

The ink IK may include a plurality of ink particles.

The base material storage unit 20 and the ink storage unit 30 may each be supported or fixed by the support member 80. The support member 80 may include a first support member 81 disposed to overlap (e.g., overlap in a third direction DR3) the base material storage unit 20 and a second support member 85 disposed to overlap (e.g., overlap in the third direction DR3) the ink storage unit 30.

The first and second support members 81 and 85 may each be connected to the surface acoustic wave module 40. The surface acoustic wave module 40 may be arranged between the first and second support members 81 and 85.

The surface acoustic wave module 40 may be connected to the base material storage unit 20 through the first inflow passage P1 and may be connected to the ink storage unit 30 through the second inflow passage P2. The base material storage unit 20 may supply the base material BM to (e.g., into) the surface acoustic wave module 40 through the first inflow passage P1, and the ink storage unit 30 may supply the ink IK to (e.g., into) the surface acoustic wave module 40 through the second inflow passage P2.

The surface acoustic wave module 40 may include the inner passage P5, a surface acoustic wave generator 45, and a module member 41 that accommodates the inner passage P5 and the surface acoustic wave generator 45.

The second support member 85 may be located at one end or side of the module member 41 in a second direction DR2, and the first support member 81 may be located at the other end or side of the module member 41 in the second direction DR2. The module member 41 may be connected to each of the support members 81 and 85. In one or more embodiments, the module member 41 may be between the first support member 81 and the second support member 85 in the second direction DR2.

The inner passage P5 may be connected to each of the inflow passages P1 and P2. The inner passage P5 may be branched at the top end thereof (e.g., one end in the third direction DR3) into the first inflow passage P1 and the second inflow passage P2. The inner passage P5 may, for example, extend along the third direction DR3. The first inflow passage P1 may be branched from the inner passage P5 in a direction (e.g., −DR2) opposite to the second direction DR2 and in the third direction DR3, and the second inflow passage P2 may be branched from the inner passage P5 to in the second direction DR2 and in the third direction DR3.

The ink base material BM may flow into the inner passage P5 through the first inflow passage P1, and the ink IK may flow into the inner passage P5 through the second inflow passage P2. The ink base material BM introduced into the inner passage P5 through the first inflow passage P1 and the ink IK introduced into the inner passage P5 through the second inflow passage P2 may meet and be mixed together in the inner passage P5 to form an ink mixture. The ink mixture may flow along the thickness direction (e.g., the direction (e.g., −DR3) opposite to the third direction DR3). The inner passage P5 may be arranged in such a way of being inserted into the module member 41.

Meanwhile, the plurality of ink particles of the ink IK flowing along the inner passage P5 may differ in particle diameter. The plurality of ink particles may have different diameters before the ink IK flows out of the ink storage unit 30 through the second inflow passage P2, or the plurality of ink particles may have the same particle diameter before the ink IK flows out through the second inflow passage P2 and adjacent ink particles may aggregate, while the ink IK flows through the second inflow passage P2, to have different particle diameters. In other words, ink particles differing in particle diameter may mix or aggregate in the second inflow passage P2. Alternatively, the plurality of ink particles adjacent to one another (e.g., ink particles differing in particle diameter) may aggregate, when the ink IK meets the ink base material BM in the inner passage P5, to have different particle diameters.

When the ink mixture is sprayed from nozzles NZ of the inkjet head unit 50, the nozzles NZ may be clogged by the ink particles having a particle diameter equal to or greater than a reference value, making it difficult to repeatedly use the nozzles NZ.

The surface acoustic wave generator 45 may produce a surface acoustic wave to the ink mixture flowing through the inner passage P5 in the third direction DR3 to separate the ink particles with a relatively small particle diameter from the ink particles with a relatively large particle diameter inside the inner passage P5.

The inner passage P5 may be branched into the first outflow passage P3 and the second outflow passage P4 at the bottom end thereof (e.g., end in a direction opposite to the third direction DR3). For example, the first outflow passage P3 may be branched from the inner passage P5 in the direction opposite to the second direction DR2 and in the direction opposite to the third direction DR3, and the second outflow passage P4 may be branched from the inner passage P5 to in the second direction DR2 and in the direction opposite to the third direction DR3.

In the ink mixture flowing through the inner passage P5, the ink base material BM may be discharged through the first and second outflow passages P3 and P4. Among the ink particles of the ink IK, the ink particles having a relatively large particle diameter may be discharged through the first outflow passage P3, and the ink particles having a relatively small particle diameter may be discharged through the second outflow passage P4. Here, the reference value of the particle diameter of particles being separated to be discharged through the outflow passages P3 and P4 may vary depending on the desired particle diameter of the ink particles of the ink IK being sprayed through the nozzles NZ. In one or more embodiments, the desired particle diameter of the ink particles of the ink IK being sprayed through the nozzles NZ may be less than about 5 μm (i.e., the reference value may be about 5 μm), but the present disclosure is not limited thereto. For example, the desired particle diameter and the corresponding reference value may vary depending on the kind of a structure to be formed on the substrate of the display panel by the ink mixture.

The surface acoustic wave generator 45 may push the ink particles having a relatively large particle diameter in the propagation direction of a surface acoustic wave and may, in contrast to the ink particles having a relatively large particle diameter, hardly (e.g., weakly) or not push the ink particles having a relatively small particle diameter in the propagation direction of a surface acoustic wave.

Because, among the plurality of ink particles of the ink IK, the ink particles having a relatively large particle diameter are discharged through the first outflow passage P3 and the ink particles having a relatively small particle diameter are discharged through the second outflow passage P4 and because the surface acoustic wave generator 45 pushes the ink particles having a relatively large particle diameter in the propagation direction of the surface acoustic wave and may, in contrast to the ink particles having a relatively large particle diameter, hardly (e.g., weakly) or not push the ink particles having a relatively small particle diameter in the propagation direction of the surface acoustic wave, the surface acoustic wave generator 45 may be located closer to the second outflow passage P4 than to the first outflow passage P3.

In this specification, the relative distance between the surface acoustic wave generator 45 and each of the outflow passages P3 and P4 may correspond to, as shown in FIG. 2, a distance from the corner of the surface acoustic wave generator 45 in the direction opposite to the second direction DR2 and in the direction opposite to the third direction DR3 (e.g., corner of a second barrel electrode 45c of FIG. 3 in the direction opposite to the second direction DR2 and in the direction opposite to the third direction DR3) to each of centers CP1 and CP2 at the points where the outflow passages P3 and P4 are in contact with (i.e., connect to) the inner passage P5. In one or more embodiments, the centers CP1 and CP2 are at respective center points of the outflow passages P3 and P4 at the bottom end of the inner passage P5.

The first center CP1 may have a first distance L1 from the corner of the surface acoustic wave generator 45 in the direction opposite to the second direction DR2 and in the direction opposite to the third direction DR3, and the second center CP2 may have a second distance L2 from the corner of the surface acoustic wave generator 45 in the direction opposite to the second direction DR2 and in the direction opposite to the third direction DR3. The second distance L2 may be shorter than the first distance L1.

In addition, because it is preferred for the ink IK to be located relatively closer to the surface acoustic wave generator 45 in the inner passage P5 for facilitating separation of the particles having a relatively large particle diameter from the particles having a relatively small particle diameter, the ink base material BM and the ink IK may be introduced into the surface acoustic wave module 40 through different inflow passages P1 and P2, respectively. In more detail, while the ink base material BM introduced into the inner passage P5 through the first inflow passage P1 and the ink IK introduced into the inner passage P5 through the second inflow passage P2 are mixed, the ink base material BM may push the ink IK toward the surface acoustic wave generator 45. This may cause a relatively large amount of the ink IK to be located close to the surface acoustic wave generator 45.

Furthermore, even if the ink base material BM and the ink IK are introduced into the surface acoustic wave module 40 through different inflow passages P1 and P2, it may be desirable for the surface acoustic wave module 40 to be closer to the second inflow passage P2 for inflow of the ink IK than to the first inflow passage P1 to enable the ink base material BM introduced into the inner passage P5 to push the ink IK toward the surface acoustic wave generator 45. That is, the surface acoustic wave generator 45 may be located relatively closer to the second inflow passage P2 than to the first inflow passage P1. However, the present disclosure is not limited thereto, and in other embodiments, the ink base material BM may not be introduced into the inner passage P5 in a manner that pushes the ink IK toward the surface acoustic wave generator 45. For example, the base material storage unit 20 and the ink storage unit 30 may be integrated into one storage unit and the ink base material BM may flow into the inner passage P5 with the ink IK.

As shown in FIG. 2, the relative distance between the surface acoustic wave generator 45 and each of the inflow passages P1 and P2 may correspond to a distance from the corner of the surface acoustic wave generator 45 in the direction opposite to the second direction DR2 and in the third direction DR3 (e.g., corner of a first barrel electrode 45b of FIG. 3 in the direction opposite to the second direction DR2 and in the third direction DR3) to each of centers CP3 and CP4 at the points where the inflow passages P1 and P2 are in contact with (i.e., connected to) the inner passage P5. In one or more embodiments, the centers CP3 and CP4 are at respective center points of the inflow passages P1 and P2 at the top end of the inner passage P5.

The third center CP3 may have a third distance L3 from the corner of the surface acoustic wave generator 45 in the direction opposite to the second direction DR2 and in the third direction DR3, and the fourth center CP4 may have a fourth distance L4 from the corner of the surface acoustic wave generator 45 in the direction opposite to the second direction DR2 and in the third direction DR3. The fourth distance L4 may be shorter than the third distance L3.

The first and second support members 81 and 85 may be disposed to overlap the waste ink collection module 60 and the connection member 90 in the third direction DR3. The first and second support members 81 and 85 may be connected to the waste ink collection module 60 and the connection member 90.

The inkjet head unit 50 may be disposed to overlap the connection member 90 in the third direction DR3. The inkjet head unit 50 may be connected to the second support member 85 via the connection member 90 and connected to the surface acoustic wave module 40 to be integrally formed.

The inkjet head unit 50 may be provided with a plurality of nozzles NZ. Although it is exemplarily shown in FIGS. 1 and 2 that the plurality of nozzles NZ protrude from the surface of the inkjet head unit 50 in the direction opposite to the third direction DR3, the present disclosure is not limited thereto, and the plurality of nozzles NZ may be arranged to be recessed into the inkjet head unit 50.

The ink mixture of the ink IK and the ink base material BM having a relatively small particle diameter may flow from the surface acoustic wave module 40 to the inkjet head unit 50 through the second outflow passage P4 and then be sprayed onto the printing target object through the plurality of nozzles NZ.

A part of the ink mixture may be sprayed onto the printing target object, and the ink mixture remaining without being sprayed may be discharged to the ink storage unit 30 through the first connection passage P6.

In some other embodiments, the base material storage unit 20 and the ink storage unit 30 may be integrated into one storage unit. In the case where the base material storage unit 20 and the ink storage unit 30 are integrated into one storage unit, the ink base material BM and the ink IK may be stored in the integrated storage unit. The ink IK may be dispersed in the ink base material BM inside the integrated storage unit. The ink IK and the ink base material BM stored in the integrated storage unit may flow into the inner passage P5 through a flow passage connecting the integrated storage unit to the inner passage P5 inside the surface acoustic wave module 40.

Figure 3:
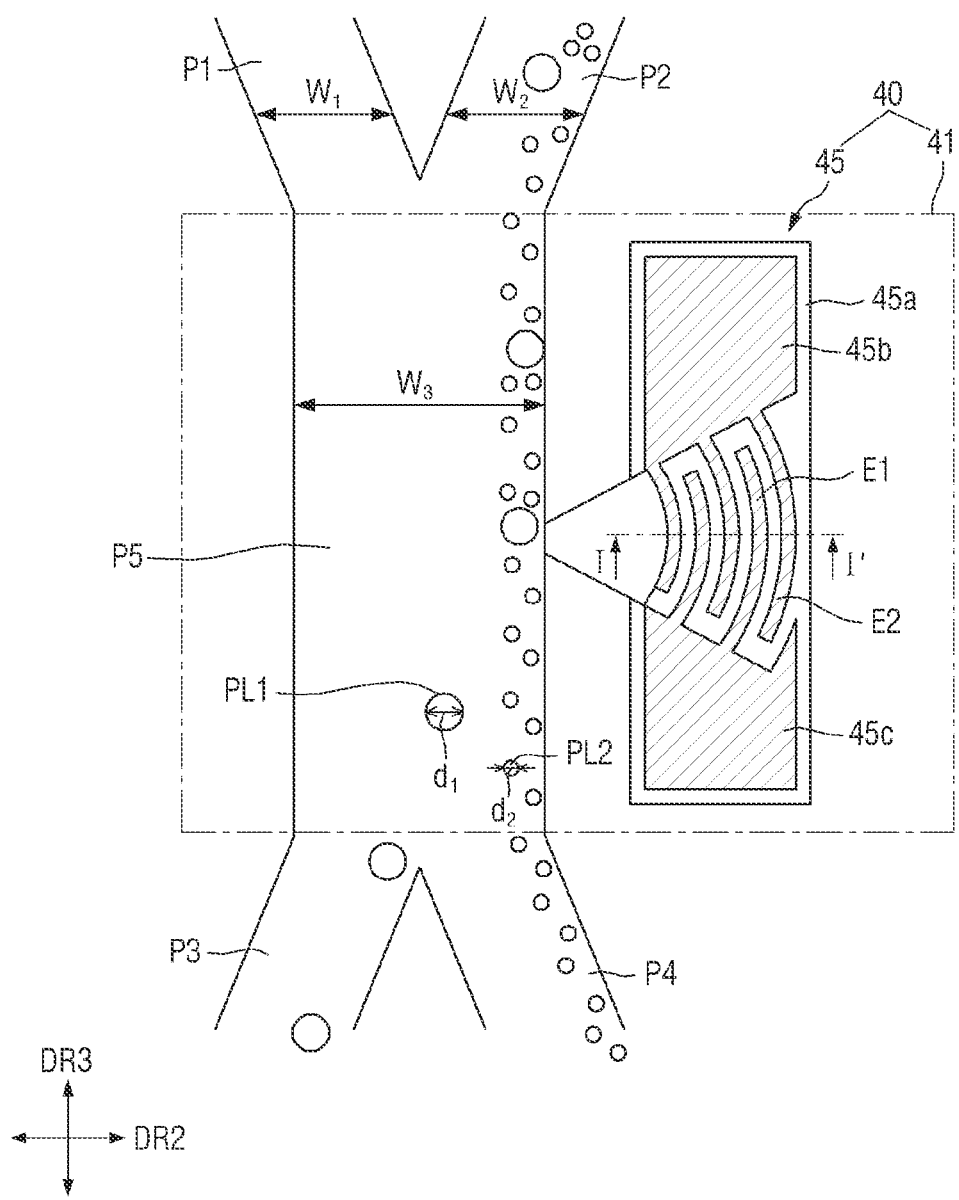
FIG. 3 is an enlarged cross-sectional view of the surface acoustic wave module of FIG. 2.
Figure 4:
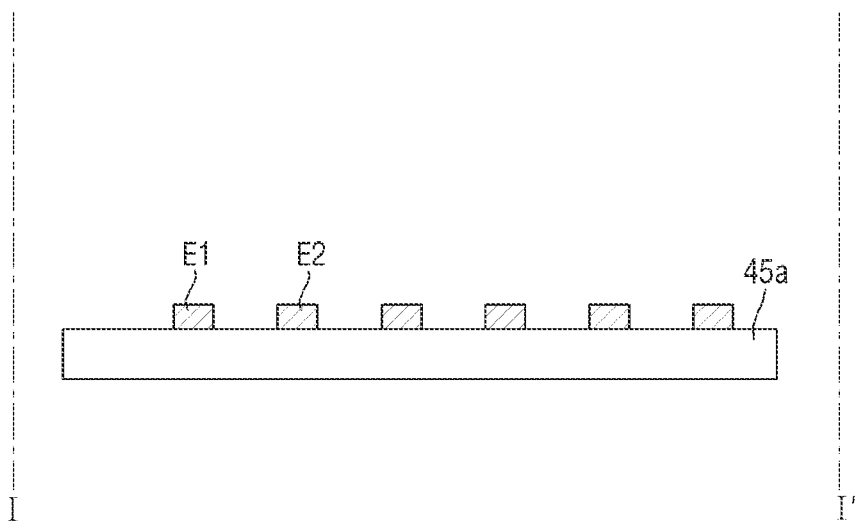
FIG. 4 is a cross-sectional view taken along the line I-I' of FIG. 3.

FIG. 3 is an enlarged cross-sectional view of the surface acoustic wave module of FIG. 2. FIG. 4 is a cross-sectional view taken along the line I-I' of FIG. 3. In FIG. 3, the outflow passages P3 and P4 connected to the surface acoustic wave module 40 and the inflow passages P1 and P2 are shown together. In addition, only the ink (e.g., ink IK in FIG. 1) is shown, with the exclusion of the ink base material (e.g., ink base material BM in FIG. 1), for explanation of separation of ink particles by the surface acoustic wave generator 45.

Referring to FIGS. 3 and 4, the inflow passages P1 and P2 may have set (e.g., predetermined) widths $W_1$ and $W_2$, respectively. For example, the first inflow passage P1 may have a first width $W_1$, and the second inflow passage P2 may have a second width $W_2$. The first and second widths $W_1$ and $W_2$ may be equal to or different from each other. The inner passage P5 may have a third width $W_3$. The third width $W_3$ may be greater than each of the first and second widths $W_1$ and $W_2$. The third width $W_3$ may be equal to or substantially equal to the sum of the first and second widths $W_1$ and $W_2$.

By setting the third width $W_3$ to be equal to or substantially equal to the sum of the first and second widths $W_1$ and $W_2$, it may be possible to avoid or reduce bottlenecking of the inflow of the ink base material BM and the ink IK into the inner passage P5 through the respective inflow passages P1 and P2.

As shown in FIG. 3, ink particles PL1 and PL2 may have different particle diameters (e.g., also referred to as particle sizes). For example, the first ink particle PL1 may have a first diameter d1, and the second ink particle PL2 may have a second diameter d2. The first diameter d1 may be greater than the desired particle diameter of the ink particles of the ink IK to be sprayed through the nozzles NZ as described above, and the second diameter d2 may be equal to or less than the desired particle diameter of the ink particles of the ink IK to be sprayed through the nozzles NZ. That is, the second diameter d2 may be less than the first diameter d1. In this case, the reference value of the particle diameter of particles being separated to be discharged through the outflow passages P3 and P4 may be a value between the first diameter d1 and the second diameter d2. Also, the particles may have an average particle diameter (D50). Within the average particle diameter range, at least two particles (e.g., two kinds of particles, each including a plurality of particles) having a different particle diameter from each other may be mixed.

In one embodiment, the particles may include a first particle (e.g., a first kind of particles including a plurality of particles having a first average particle diameter (D50)) and a second particle (e.g., a second kind of particles including a plurality of particles having a second average particle diameter (D50)) having a smaller particle diameter (e.g., average particle diameter) than the first particle. Here, the average particle diameter may be, for example, a median diameter (D50) measured using a laser diffraction particle diameter distribution meter.

The surface acoustic wave generator 45 may push the first ink particles PL1 in the propagation direction of the surface acoustic wave (e.g., in the direction opposite to the second direction DR2) and may hardly (e.g., weakly) or not push the second ink particles PL2 in the propagation direction of the surface acoustic wave.

This may facilitate discharging of the first ink particles PL1 through the first outflow passage P3 and discharging of the second ink particles PL2 through the second outflow passage P4.

The surface acoustic wave generator 45 may have a linear shape with long sides extending in the third direction DR3. The extending direction of the surface acoustic wave generator 45 may be substantially identical with the extending direction of the inner passage P5. The surface acoustic wave generator 45 may have a rectangular shape having long sides extending in the third direction DR3 and short sides extending in the second direction DR2 in a plan view. The surface acoustic wave generator 45 may include a piezo substrate 45a and a plurality of electrodes disposed on the piezo substrate 45a.

The piezo substrate 45a may be substantially identical in shape with the surface acoustic wave generator 45 in the plan view. The piezo substrate 45a may be a piezoelectric substrate. The piezoelectric substrate may include a piezoelectric material that is changed according to the driving voltage applied to each of the branch electrodes to be described later.

A plurality of electrodes may be disposed on the piezo substrate 45a. The plurality of electrodes may include barrel electrodes 45b and 45c and branch electrodes E1 and E2 branched from the respective barrel electrodes 45b and 45c.

The first barrel electrode 45b may be located in the third direction DR3 in comparison with (i.e., relative to) the second barrel electrode 45c, and the second barrel electrode 45c may be located in the direction opposite to the third direction DR3 in comparison with (i.e., relative to) the first barrel electrode 45b. A set (e.g., predetermined) voltage may be applied to each of the barrel electrodes 45b and 45c.

The first electrode E1 may be mostly branched from the first barrel electrode 45b in the direction opposite to the third direction DR3, and the second electrode E2 may be mostly branched from the second barrel electrode 45c in the third direction DR3. The electrodes may each be plural in number. Although it is shown in FIGS. 3 and 4 that there are three first electrodes E1 and three second electrodes E2, the numbers of the electrodes E1 and E2 are not limited thereto. The first and second electrodes E1 and E2 may be alternately arranged along the second direction DR2. The first and second electrodes E1 and E2 adjacent to each other may be arranged to be spaced from (e.g., spaced apart from) each other in the second direction DR2.

The piezo substrate 45a may contract or expand according to the difference between the driving voltages applied to the first and second electrodes E1 and E2 and generate a surface acoustic wave propagating along a direction opposite to the second direction DR2.

The first ink particles PL1 discharged through the first outflow passage P3 may be greater in average particle diameter than the second ink particles PL2 discharged through the second outflow passage P4. Although the ink particles having a particle diameter equal to or greater than the first diameter d1, which are not guided to the first outflow passage P3, may be present in the second outflow passage P4, because the surface acoustic wave generator 45 pushes the ink particles having a relatively large particle diameter in the propagation direction of the surface acoustic wave and may, in contrast to the ink particles having a relatively large particle diameter, hardly (e.g., weakly) or not push the ink particles having a relatively small particle diameter in the propagation direction of the surface acoustic wave, the second ink particles PL2 discharged through the second outflow passage P4 may be smaller in average particle diameter than the first ink articles PL1 discharged through the first outflow passage P3.

Figure 5:
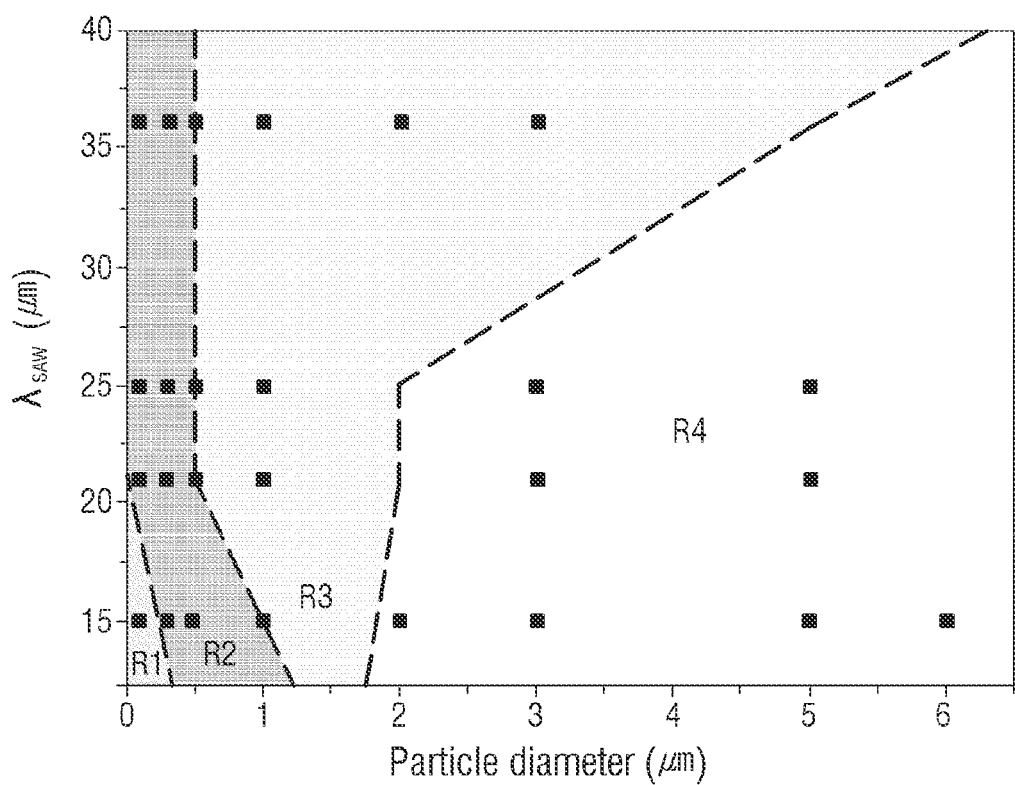
FIG. 5 is a graph illustrating behavior of ink particles according to a wavelength of a surface acoustic wave.
Figure 6:
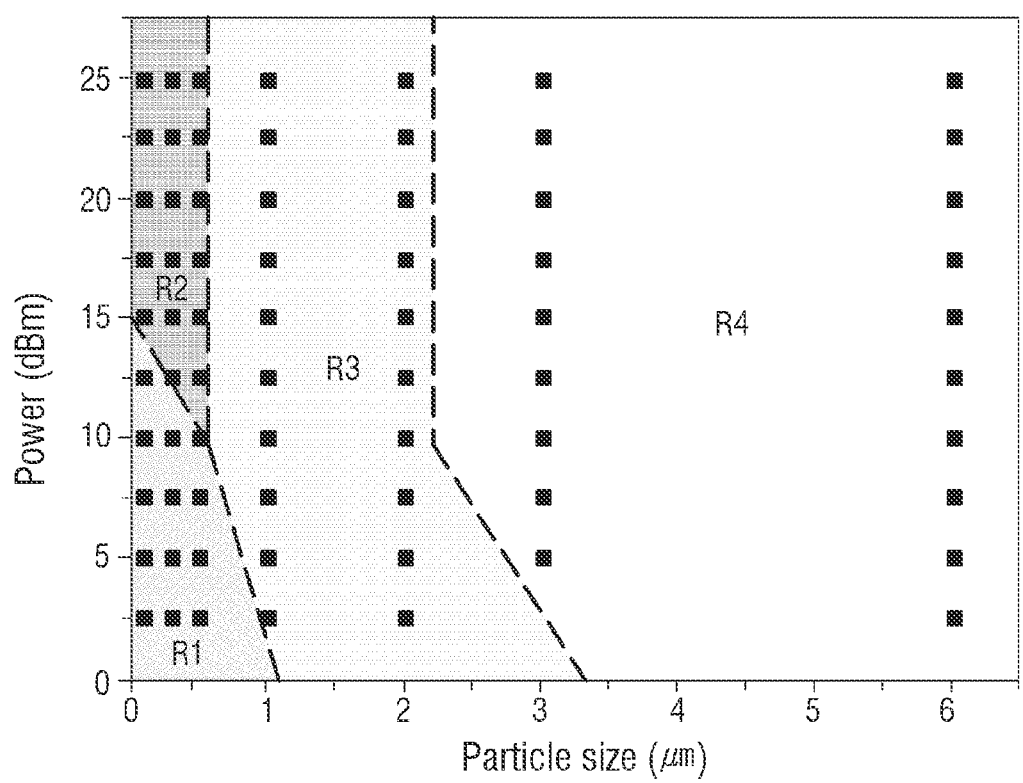
FIG. 6 is a graph illustrating behaviors of ink particles according to an intensity of a surface acoustic wave.

FIG. 5 is a graph illustrating behavior of ink particles according to a wavelength of a surface acoustic wave. FIG. 6 is a graph illustrating behaviors of ink particles according to an intensity of a surface acoustic wave. In FIG. 5, the horizontal axis represents the diameter (particle diameter, μm) of the ink particles, and the vertical axis represents the wavelength ($\lambda_{SAW}$, μm) of the surface acoustic wave. In FIG. 6, the horizontal axis represents the diameter (particle diameter, μm) of the ink particles, and the vertical axis represents the power (or intensity) (power, dBm) of the surface acoustic wave FIGS. 5 and 6 illustrate various behaviors of ink particles depending on diameter of the ink particles and the wavelength of the surface acoustic wave and depending on the diameter of the ink particles and the power of the surface acoustic wave, respectively. The ink particles show the corresponding behaviors in several behavioral areas. The behavioral areas may include a first behavioral area R1, a second behavioral area R2, a third behavioral area R3, and a fourth behavioral area R4. The dash lines indicate boundaries between the behavioral areas R1, R2, R3, and R4.

The ink particles show a behavior of constant streaming (acoustic streaming) (hereinafter, referred to as first behavior) by absorbing the surface acoustic wave in the first behavioral area R1, a behavior of streaming and constant patterning (hereinafter, referred to as second behavior) by absorbing the surface acoustic wave in the second behavioral area R2, a behavior of constant patterning (hereinafter, referred to as third behavior) in the third behavioral area R3, a behavior of patterning and drifting in the propagation direction of the surface acoustic wave at the boundary between the third and fourth behavioral areas R3 and R4, and a behavior of drifting in the propagation direction of the surface acoustic wave (hereinafter, referred to as fourth behavior) in the fourth behavioral area R4. The ink particles showing the fourth behavior may be separated from the ink particles showing the first to third behaviors (i.e., the first behavior, the second behavior, and the third behavior) as described above with reference to FIG. 3.

As shown in FIG. 5, it was found that the ink particle diameter corresponding to the boundary between the third and fourth behavioral areas R3 and R4 tended to increase as the wavelength of the surface acoustic wave increased. If the first diameter d1, which is greater than the desired particle diameter of the ink particles of the ink IK to be sprayed through the nozzles NZ, is about 2 μm, the wavelength of the surface acoustic wave, at the boundary between the third and fourth behavioral areas R3 and R4, is about 25 μm. That is, if the wavelength of the surface acoustic wave is about 25 μm or more, the ink particles of which the first diameter d1 is about 2 μm or more may show the fourth behavior. In addition, if the first diameter d1, which is greater than the desired particle diameter of the ink particles of the ink IK to be sprayed through the nozzles NZ, is about 3 μm, the wavelength of the surface acoustic wave, at the boundary between the third and fourth behavioral areas R3 and R4, is about 28 μm. That is, if the wavelength of the surface acoustic wave is about 28 μm or more, the ink particles of which the first diameter d1 is about 3 μm or more may show the fourth behavior.

Furthermore, as shown in FIG. 6, it was found that the ink particle diameter corresponding to the boundary between the third and fourth behavioral areas R3 and R4 tended to increase as the intensity of the surface acoustic wave decreased (e.g., at intensity equal to or less than 10 dBm). If the first diameter d1, which is greater than the desired diameter of the ink particles of the ink IK to be sprayed through the nozzles NZ, is about 2 μm, the intensity of the surface acoustic wave, at the boundary between the third and fourth behavioral area R3 and R4, is about 10 dBm. That is, if the intensity of the surface acoustic wave is about 10 dBm or less, the ink particles of which the first diameter d1 is about 2 μm or more may show the fourth behavior. In addition, if the first diameter d1, which is greater than the desired particle diameter of the ink particles of the ink IK to be sprayed through the nozzles NZ, is about 3 μm, the intensity of the surface acoustic wave, at the boundary between the third and fourth behavioral areas R3 and R4, is about 2.5 dBm. That is, if the intensity of the surface acoustic wave is about 2.5 dBm or less, the ink particles of which the first diameter d1 is about 3 μm or more may show the fourth behavior.

In an embodiment, the first diameter d1, which is greater than the desired particle diameter of the ink particles of the ink IK to be sprayed through the nozzles NZ, may be changed as desired and, even when the first diameter d1 is changed, it may be possible to separate (e.g., easily separate) the ink particles having a diameter equal to or greater than the desired first diameter d1 from the ink particles having a diameter less than the first diameter d1 by adjusting the wavelength or intensity of the surface acoustic wave.

Because the inkjet printing apparatus 10 according to an embodiment requires no separate filter for filtering the ink particles having a diameter greater than a desired particle diameter, there is neither pressure drop caused by the ink particles filtered out by the filter between the ink cartridge and the inkjet head nor an associated periodic filter replacement, leading to cost reduction and avoidance of productivity reduction.

Hereinafter, a method of manufacturing a display device according to an embodiment will be described. In the following embodiment, the same components as those of the above-described embodiment are denoted by the same reference numerals, and a description thereof may not be repeated or may be simplified.

Figure 8:
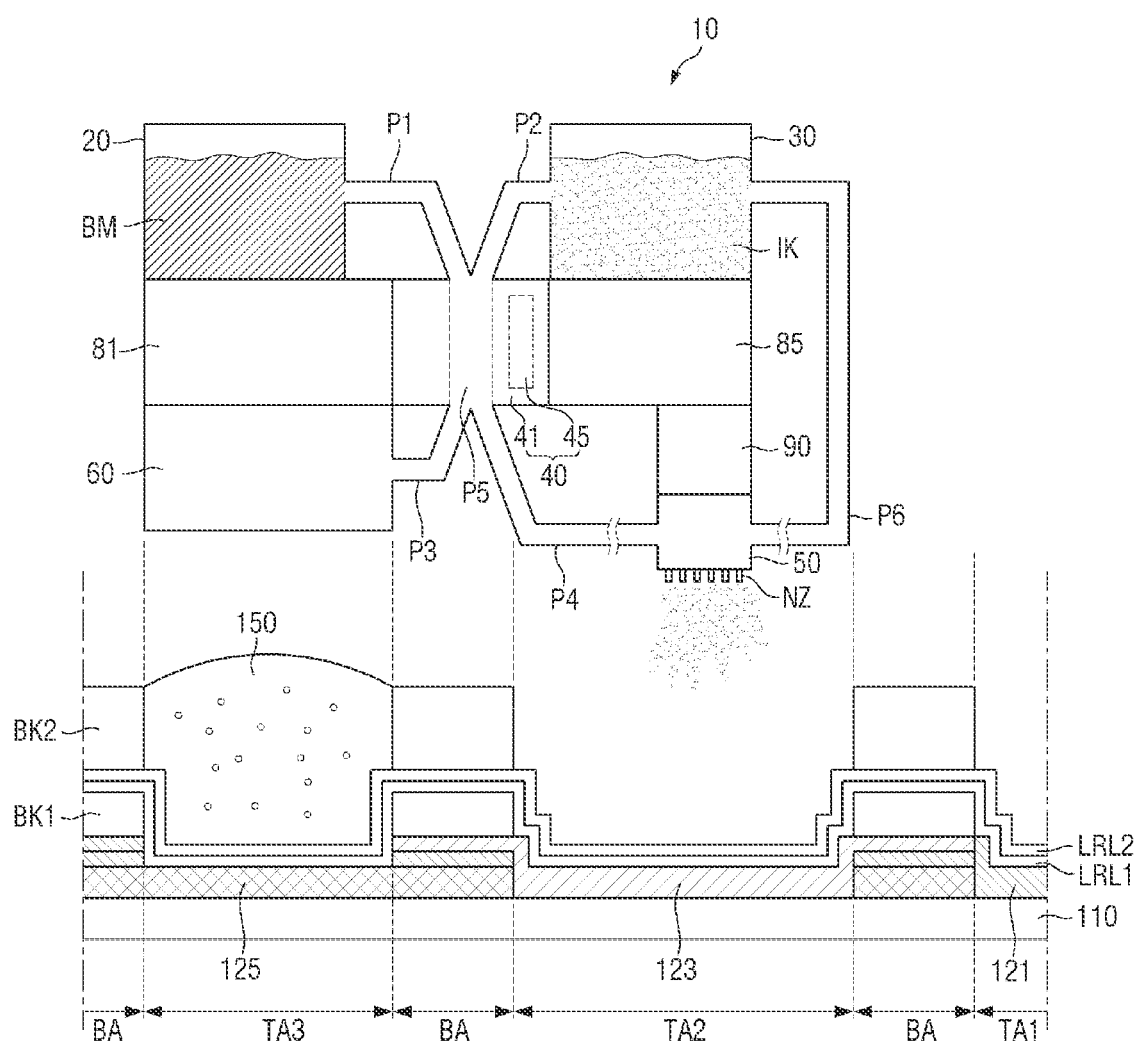
FIG. 8 is a cross-sectional view illustrating a processing act of a method of manufacturing a display device.

FIG. 7 is a flowchart illustrating a method of manufacturing a display device according to an embodiment. FIG. 8 is a cross-sectional view illustrating a processing act of a method of manufacturing a display device.

Referring to FIGS. 2, 3, 7, and 8, the ink base material BM the ink IK including a plurality of ink particles PL1 and PL2 are respectively introduced into the inner passage P5 (act S10).

The base material storage unit 20 may provide the ink base material BM to the inner passage P5 of the surface acoustic wave module 40 through the first inflow passage P1, and the ink storage unit 30 may concurrently (e.g., simultaneously) provide the ink IK to the inner passage P5 of the surface acoustic wave module 40 through the second inflow passage P2.

In the inner passage P5, the ink IK is dispersed in the ink base material BM and they are mixed with each other.

Next, in the inner passage P5, the first and second ink particles PL1 and PL2 are separated based on the first particle diameter d1 (act S20). The separation (act S20) of the first and second ink particles PL1 and PL2 may be performed by the surface acoustic wave generator 45 of the surface acoustic wave module 40.

As the mixed ink base material BM and the ink IK flow through the inner passage P5, the surface acoustic wave generator 45 generates a surface acoustic wave to separate ink particles having a relatively small particle diameter from ink particles having a relatively large particle diameter from among the plurality of ink particles of the ink IK. Thus, among the plurality of ink particles of the ink IK, the ink particles having a relatively large particle diameter are discharged through the first outflow passage P3, and the ink particles have a relatively small diameter are discharged through the second outflow passage P4.

At act S20 of separating the first and second ink particles PL1 and PL2, the first and second ink particles PL1 and PL2 may be separated by adjusting the wavelength and intensity of the surface acoustic wave. For example, in order to separate the ink particles having a diameter of about 2 μm or more into the first outflow passage P3, it may be possible to adjust the wavelength of the surface acoustic wave to be about 25 μm or more and the intensity of the surface acoustic wave to be about 10 dBm or less.

In addition, in order to separate the ink particles having a diameter of about 3 μm or more into the first outflow passage P3, it may be possible to adjust the wavelength of the surface acoustic wave to be about 28 μm or more and the intensity of the surface acoustic wave to be about 2.5 dBm or less.

The ink particles having a relatively large particle diameter and separated into the first outflow passage P3 are stored in the waste ink collection module 60, and the ink particles having a relatively small particle diameter and separated into the second outflow passage P4 (e.g., second ink particles PL2) and the ink base material BM are moved into the inkjet head unit 50 and sprayed onto the printing target object through the plurality of nozzles NZ (act S30).

FIG. 8 illustrates a case where the printing target object is a substrate of a quantum dot light emitting display panel and, in this case, the ink base material BM being sprayed from the nozzles NZ may include a base resin and the ink IK may include wavelength shifters and scatterers. FIG. 7 shows a process of forming a wavelength conversion pattern and/or a light transmission pattern of the quantum dot light emitting display panel. The quantum dot light emitting display panel may include a base substrate 110 on which a plurality of light transmitting areas TA1, TA2, and TA3 and a light blocking area BA located between the adjacent light transmitting areas TA1, TA2, and TA3 are defined, a plurality of color filters 121, 123, and 125 on the base substrate 110, a capping layer CPL on the color filters 121, 123, and 125, and banks BK disposed within the light blocking area BA on the capping layer CPL. The plurality of light transmitting areas TA1, TA2, and TA3 may be repeatedly disposed. The first color filter 121 may selectively transmit red light and block or absorb blue light and green light. The second color filter 123 may selectively transmit green light and block or absorb blue light and red light. The third color filter 125 may selectively transmit blue light and block or absorb red light and green light.

The first color filter 121 may be located in the first light transmitting area TA1, the second color filter 123 may be located in the second light transmitting area TA2, and the third color filter 125 may be located in the third light transmitting area TA3. The third color filter 125 may be further disposed in the light blocking area BA adjacent to the third light transmitting area TA3 and the light blocking area BA positioned between the first and second light transmitting areas TA1 and TA2. The first color filter 121 may be disposed on one surface of the third color filter 125 in the light blocking area BA. In addition, the second color filter 123 may be disposed on one surface of the first color filter 121 in the light blocking areas BA adjacent to the second light transmitting area TA2 and the light blocking area BA positioned between the first and third light transmitting areas TA1 and TA3.

The plurality of nozzles NZ connected to the inkjet head unit 50 spray a wavelength conversion pattern material between adjacent banks BK on the capping layer CPL to form a wavelength conversion pattern and/or a light transmission pattern 150.

The ink mixture remaining inside the inkjet head unit 50 without being sprayed is discharged to the ink storage unit 30 through the first connection passage P6.

The amount of the ink IK in the ink storage unit 30 may decrease as the spraying process is repeated with the nozzles NZ of the inkjet head unit 50. In one or more embodiments, the ink storage unit 30 may be replenished with the ink IK having the same amount as the ink IK sprayed during the spraying process through a separate inflow passage. Although the process of spraying the ink mixture including the ink IK and the process of replenishing the ink IK through a separate inflow passage may be concurrently (e.g., simultaneously) performed, the present disclosure is not limited thereto.

Figure 9:
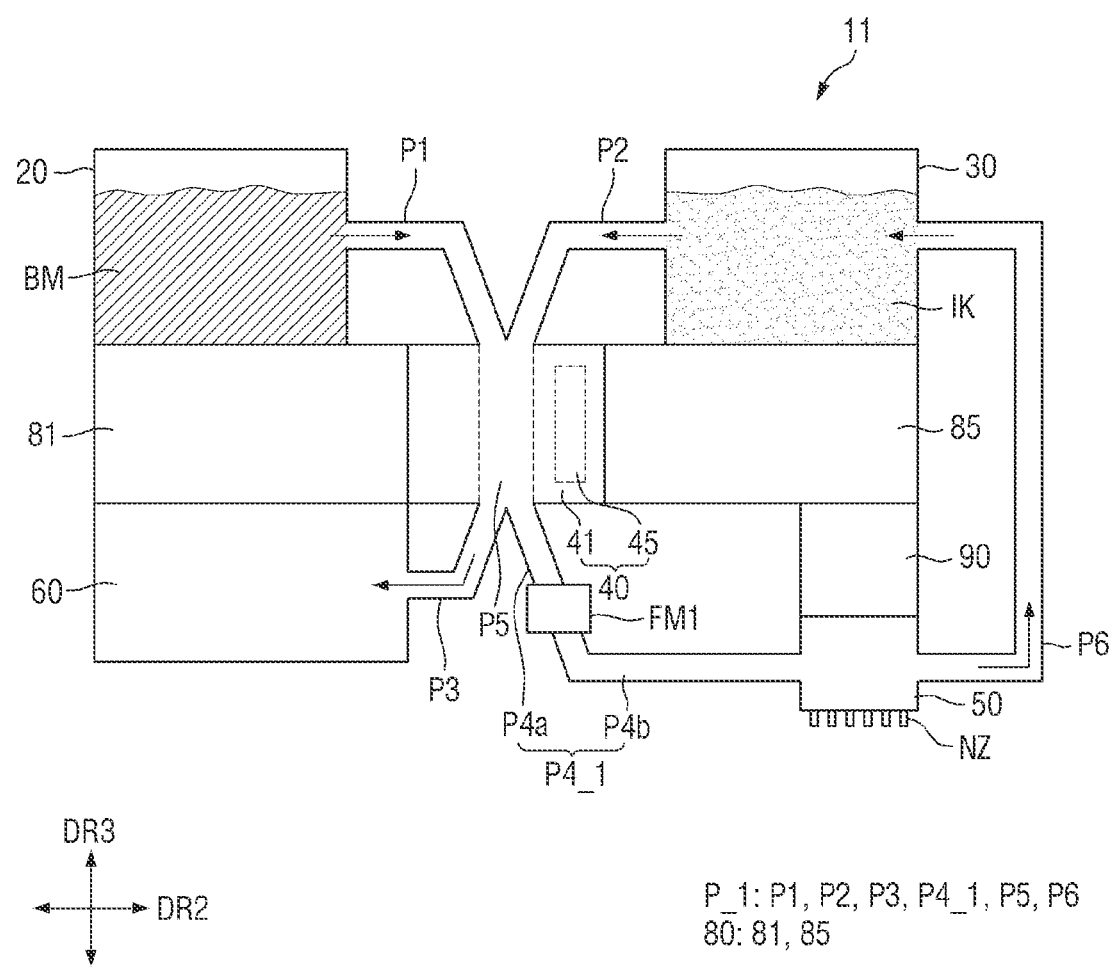
FIG. 9 is a cross-sectional view of an inkjet printing apparatus according to another embodiment.
Figure 10:
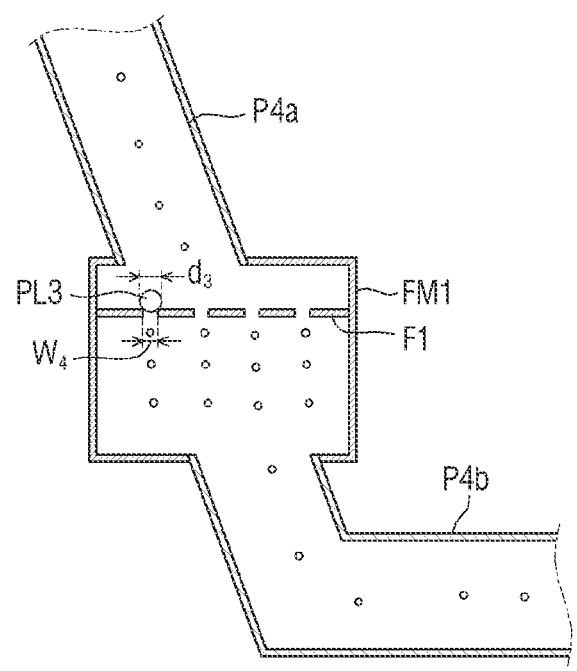
FIG. 10 is an enlarged cross-sectional view of a first filter module of FIG. 9.

FIG. 9 is a cross-sectional view of an inkjet printing apparatus according to another embodiment. FIG. 10 is an enlarged cross-sectional view of a first filter module of FIG. 9.

Referring to FIGS. 9 and 10, an inkjet printing apparatus 11 according to this embodiment differs from the inkjet printing apparatus 10 of FIG. 2 in that a first filter module FM1 connected to a second outflow passage P4_1 is further included.

In more detail, the inkjet printing apparatus 11 according to this embodiment may further include the first filter module FM1 connected to the second outflow passage P4_1. The second outflow passage P4_1 may include a $(2a)^{th}$ outflow passage P4a connecting the inner passage P5 to the first filter module FM1 and a $(2b)^{th}$ outflow passage P4b connecting the first filter module FM1 to the inkjet head unit 50.

The first filter module FM1 serves to filter the third ink particles PL3 having a particle diameter equal to or greater than the first diameter d1, the third ink particles PL3 being not moved to the first outflow passage P3 from the inner passage P5 by the surface acoustic wave generator 45.

The first filter module FM1 may include a plurality of first filters F1. A separation distance (e.g., fourth width $W_4$) between adjacent first filters F1 may be less than the first diameter d1. In one or more embodiments, any suitable shape and/or number of first filters F1 may be used to provide the separation distance (e.g., fourth width $W_4$). For example, in one or more embodiments, a series of overlapping and/or adjacent first filters F1 spaced from each other by the separation distance (e.g., fourth width $W_4$) may be provided, and in other embodiments, a first filter F1 with a plurality of pores providing the separation distance (e.g., fourth width $W_4$) may be provided.

Figure 11:
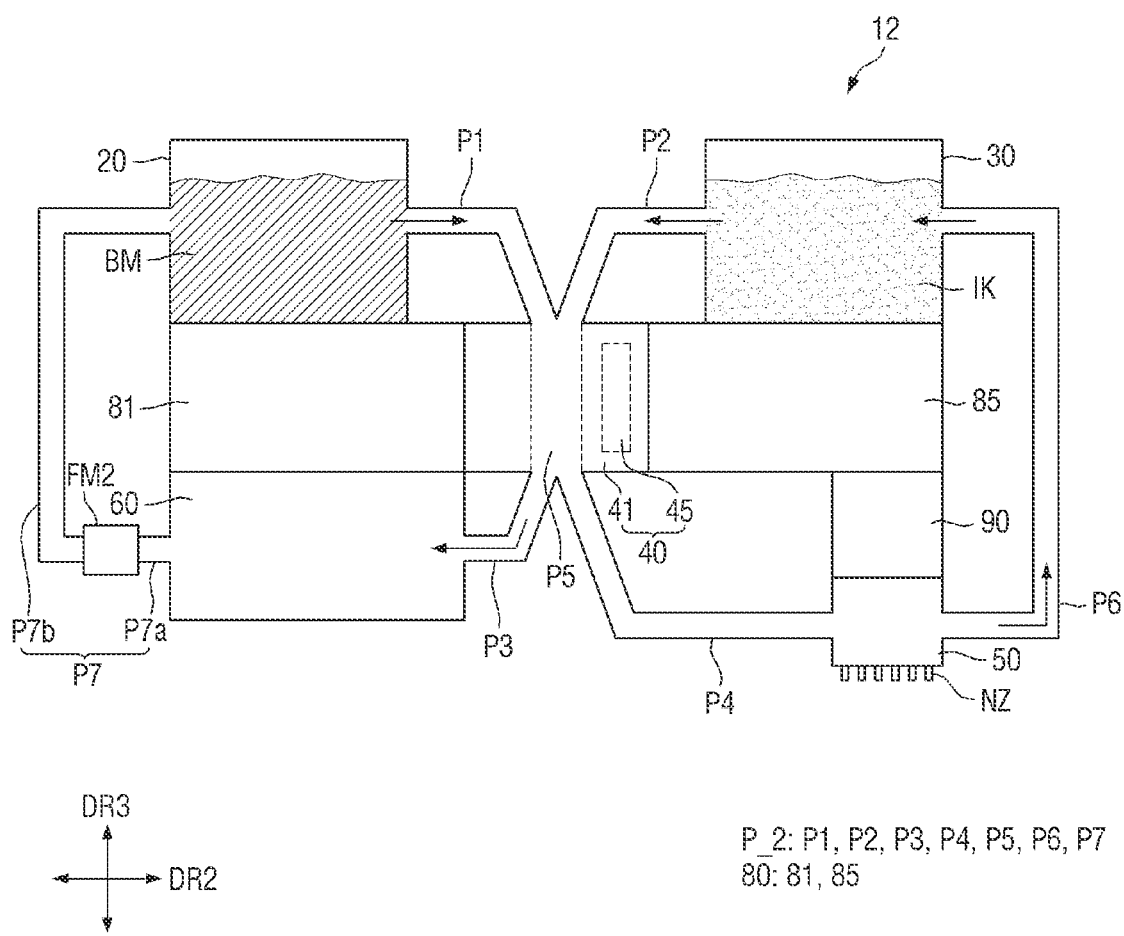
FIG. 11 is a cross-sectional view of an inkjet printing apparatus according to still another embodiment.
Figure 12:
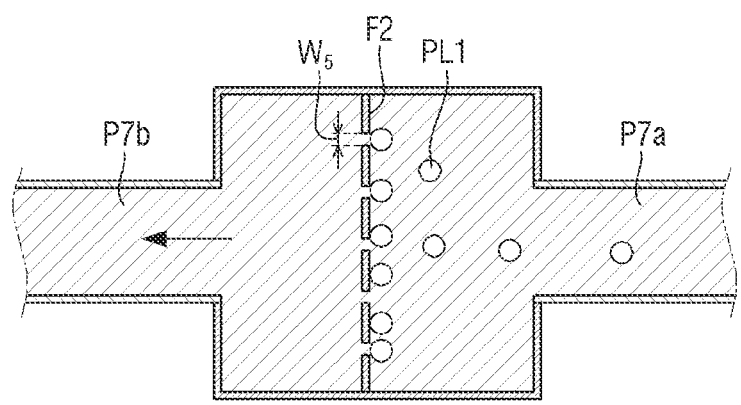
FIG. 12 is an enlarged cross-sectional view of a second filter module of FIG. 11.

FIG. 11 is a cross-sectional view of an inkjet printing apparatus according to still another embodiment. FIG. 12 is an enlarged cross-sectional view of a second filter module of FIG. 11.

Referring to FIGS. 11 and 12, an inkjet printing apparatus 12 according to this embodiment differs from the inkjet printing apparatus 10 of FIG. 2 in that a second connection passage P7 and a second filter module FM2 connected to the second connection passage P7 are further included.

In more detail, the inkjet printing apparatus 12 according to this embodiment may further include the second connection passage P7 and the second filter module FM2 connected to the second connection passage P7. The second connection passage P7 may include a $(2a)^{th}$ connection passage P7a connecting the waste ink collection module 60 to the second filter module FM2 and a $(2b)^{th}$ connection passage P7b connecting the second filter module FM2 to the base material storage unit 20.

The second filter module FM2 serves to filter the first ink particles PL1 having a particle diameter equal to or greater than the first diameter d1, the first ink particles PL1 being moved to the waste ink collection module 60 by the surface acoustic wave generator 45.

The second filter module FM2 may include a plurality of second filters F2. A separation distance (e.g., fifth width $W_5$) between adjacent second filters F2 may be less than the first diameter d1. In one or more embodiments, any suitable shape and/or number of second filters F2 may be used to provide the separation distance (e.g., fifth width $W_5$). For example, in one or more embodiments, a series of overlapping and/or adjacent second filters F2 spaced from each other by the separation distance (e.g., fifth width $W_5$) may be provided, and in other embodiments, a second filter F2 with a plurality of pores providing the separation distance (e.g., fifth width $W_5$) may be provided.

Meanwhile, given that the ink particles filtered through the first filter F1 described above with reference to FIG. 10 are provided to the inkjet head unit 50 and the ink particles filtered through the second filter F2 are provided again to the base material storage unit 20, a desired separation distance $W_4$ between adjacent first filters F1 may be less than a desired separation distance $W_5$ between adjacent second filters F2.

Figure 13:
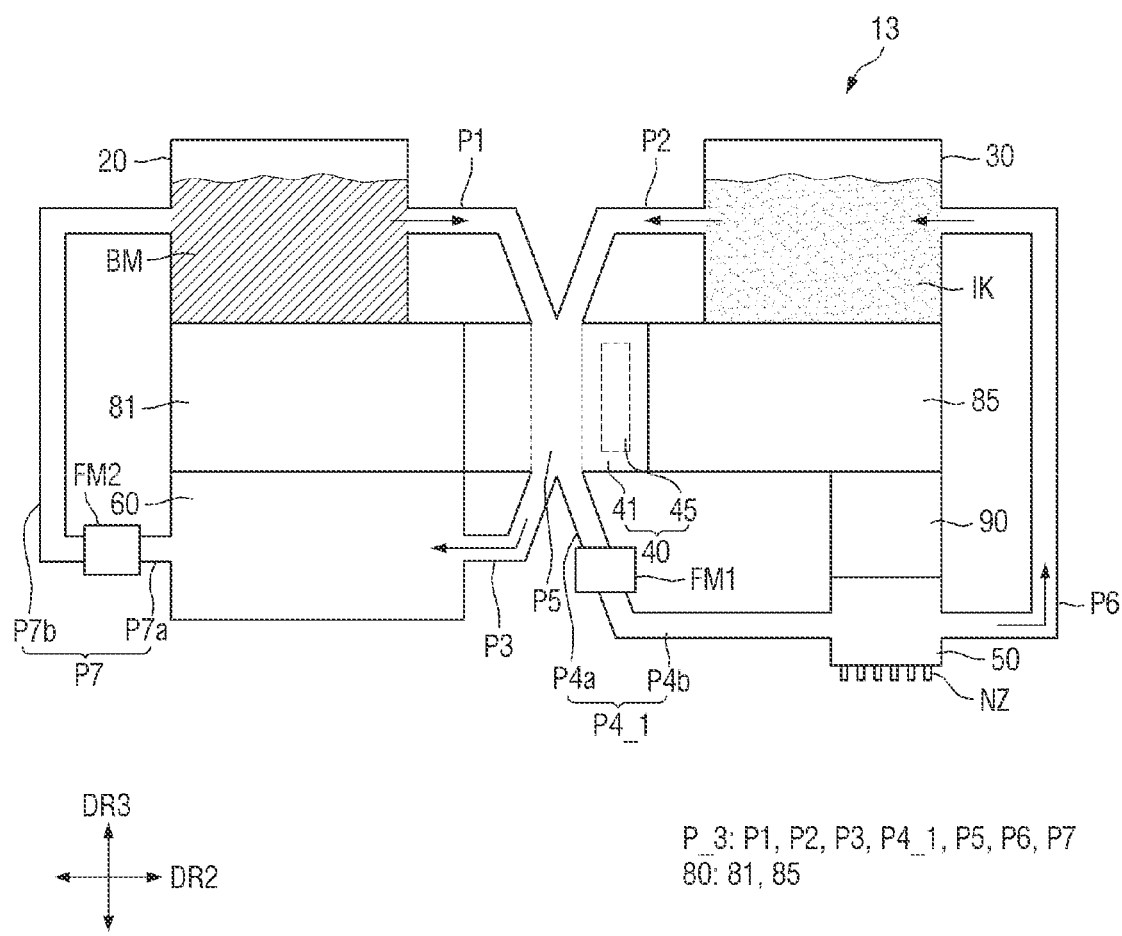
FIG. 13 is a cross-sectional view of an inkjet printing apparatus according to still another embodiment.

FIG. 13 is a cross-sectional view of an inkjet printing apparatus according to still another embodiment.

Referring to FIG. 13, an inkjet printing apparatus 13 according to this embodiment differs from the inkjet printing apparatus 11 of FIG. 9 in that a second connection passage P7 and a second filter module FM2 connected to the second connection passage P7 are further included.

In more detail, the inkjet printing apparatus 13 according to this embodiment may further include the first filter module FM1 described above with reference to FIG. 8, the second connection passage P7 described above with reference to FIG. 10, and the second filter module FM2 connected to the second connection passage P7.

The detailed descriptions of the filter modules FM1 and FM2 and the second connection passage P7 have been made with reference to FIGS. 9 and 11 and may not be repeated below to avoid redundancy.

Figure 14:
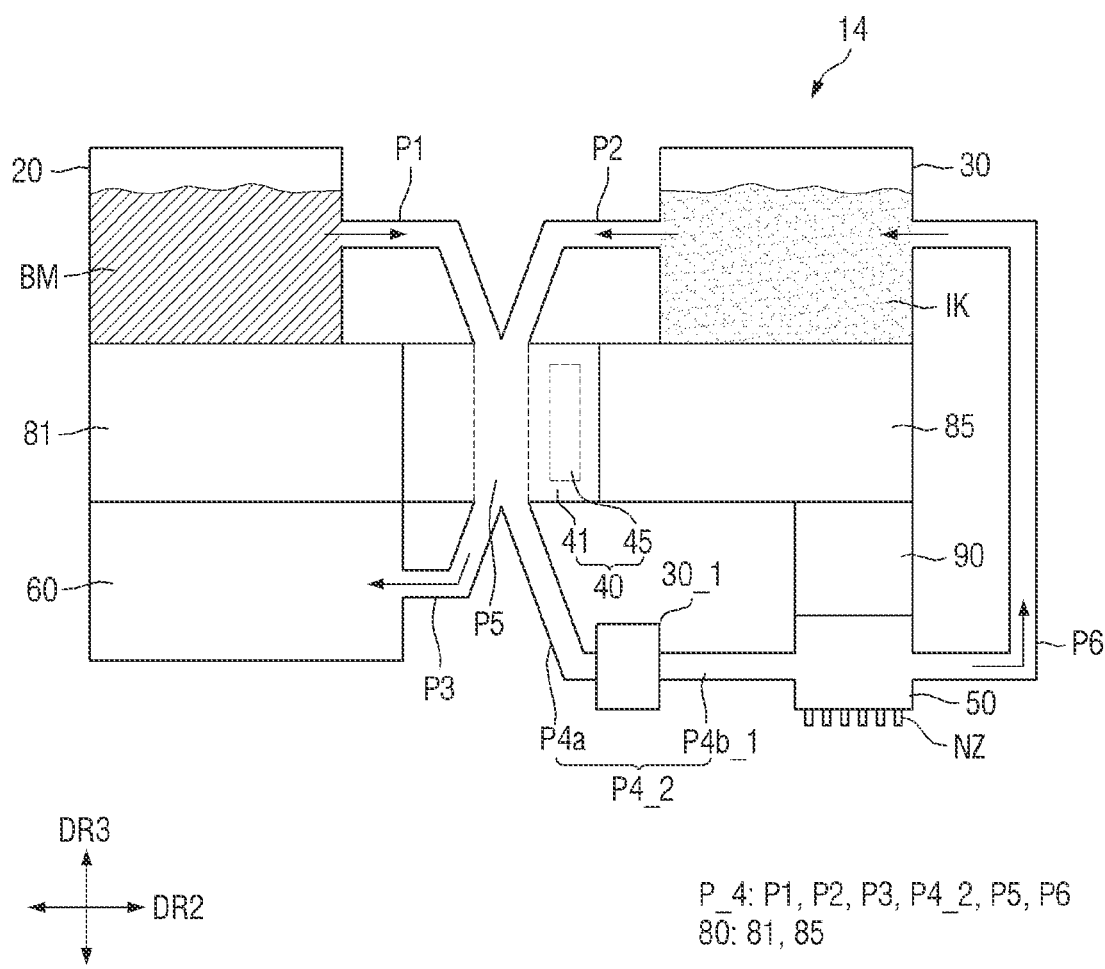
FIG. 14 is a cross-sectional view of an inkjet printing apparatus according to still another embodiment.

FIG. 14 is a cross-sectional view of an inkjet printing apparatus according to still another embodiment.

Referring to FIG. 14, an inkjet printing apparatus 14 according to this embodiment differs from the inkjet printing apparatus 10 of FIG. 2 in that an ink mixture storage unit 30_1 connected to a second outflow passage P4_2 is further included.

In more detail, the inkjet printing apparatus 14 according to this embodiment may further include the ink mixture storage unit 30_1 connected to the second outflow passage P4_2.

The second outflow passage P4_2 may include a $(2a)^{th}$ outflow passage P4a connecting the inner passage P5 to the ink mixture storage unit 30_1 and a $(2b)^{th}$ outflow passage P4b_1 connecting the ink mixture storage unit 30_1 to the inkjet head unit 50.

The ink mixture storage unit 30_1 may further include a discharge controller for controlling discharge of the ink mixture stored therein to the $(2b)^{th}$ outflow passage P4b_1.

Other descriptions have been made above and may not be repeated below to avoid redundancy.

Figure 15:
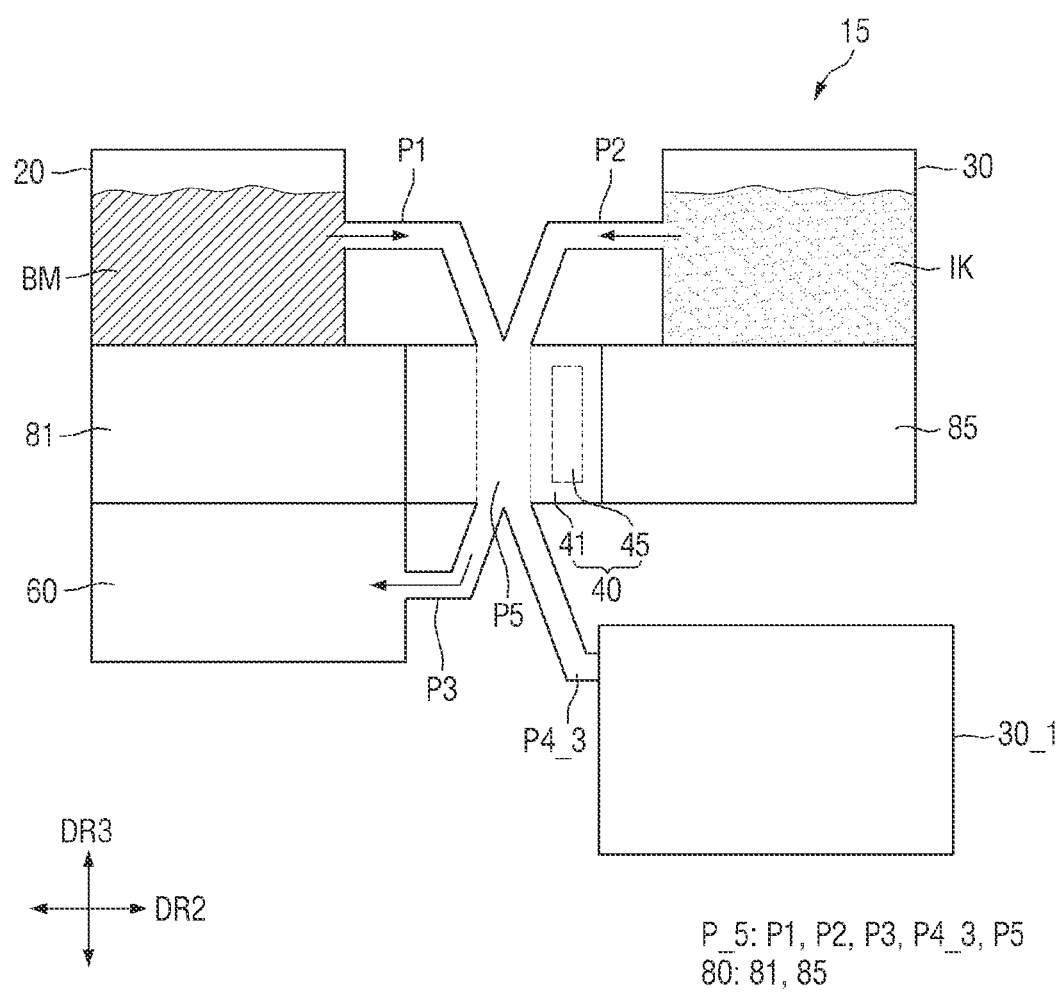
FIG. 15 is a cross-sectional view of an inkjet printing apparatus according to still another embodiment.

FIG. 15 is a cross-sectional view of an inkjet printing apparatus according to still another embodiment.

Referring to FIG. 15, an inkjet printing apparatus 15 according to this embodiment differs from the inkjet printing apparatus 10 of FIG. 2 in that an inkjet mixture storage unit 30_1 connected to a second outflow passage P4_3 is further included.

In more detail, the inkjet printing apparatus 15 according to this embodiment may further include the ink mixture storage unit 30_1 connected to the second outflow passage P4_3. The inkjet printing apparatus 15 according to this embodiment may not include the inkjet head unit 50 (e.g., see FIG. 13). Unlike FIG. 13, the ink mixture storage unit 30_1 may be separated from the inkjet head unit 50 (e.g., see FIG. 13). The inkjet mixture storage unit 30_1 according to this embodiment serves to store ink particles having a particle diameter equal to or less than the first diameter d1 by the surface acoustic wave generator 45.

Figure 16:
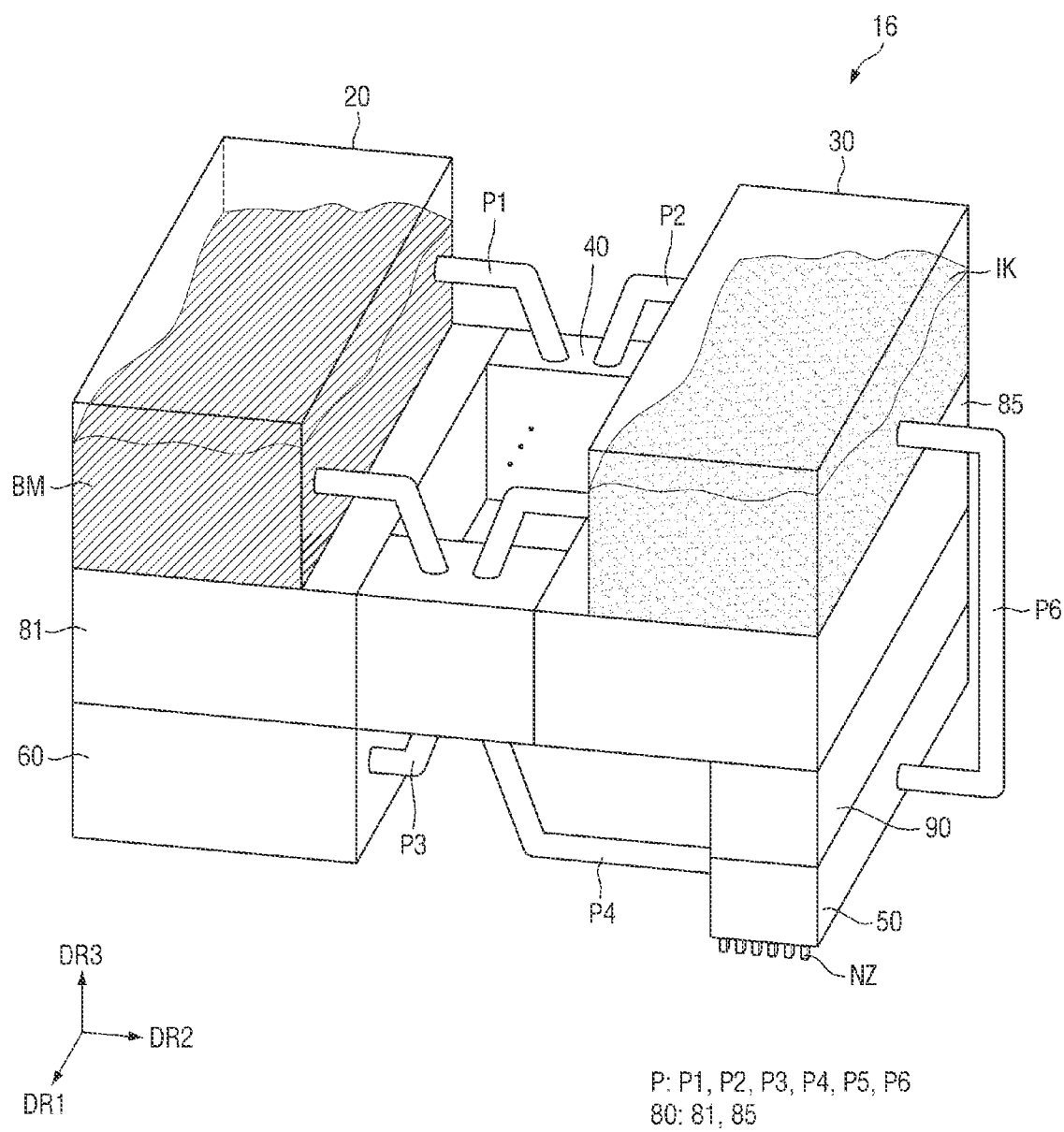
FIG. 16 is a perspective view of an inkjet printing apparatus according to still another embodiment.

FIG. 16 is a perspective view of an inkjet printing apparatus according to still another embodiment.

Referring to FIG. 16, an inkjet printing apparatus 16 according to this embodiment differs from the inkjet printing apparatus 10 of FIG. 1 in that a plurality of surface acoustic wave modules 40 are included.

In more detail, the inkjet printing apparatus 16 according to this embodiment may include a plurality of surface acoustic wave modules 40.

The plurality of surface acoustic wave modules 40 may be arranged along a first direction DR1. The surface acoustic wave module 40 may be connected to the base material storage unit 20 and the ink storage unit 30 through the inflow passages P1 and P2 and connected to waste ink collection module 60 and the inkjet head unit 50 through the outflow passages P3 and P4.

Figure 17:
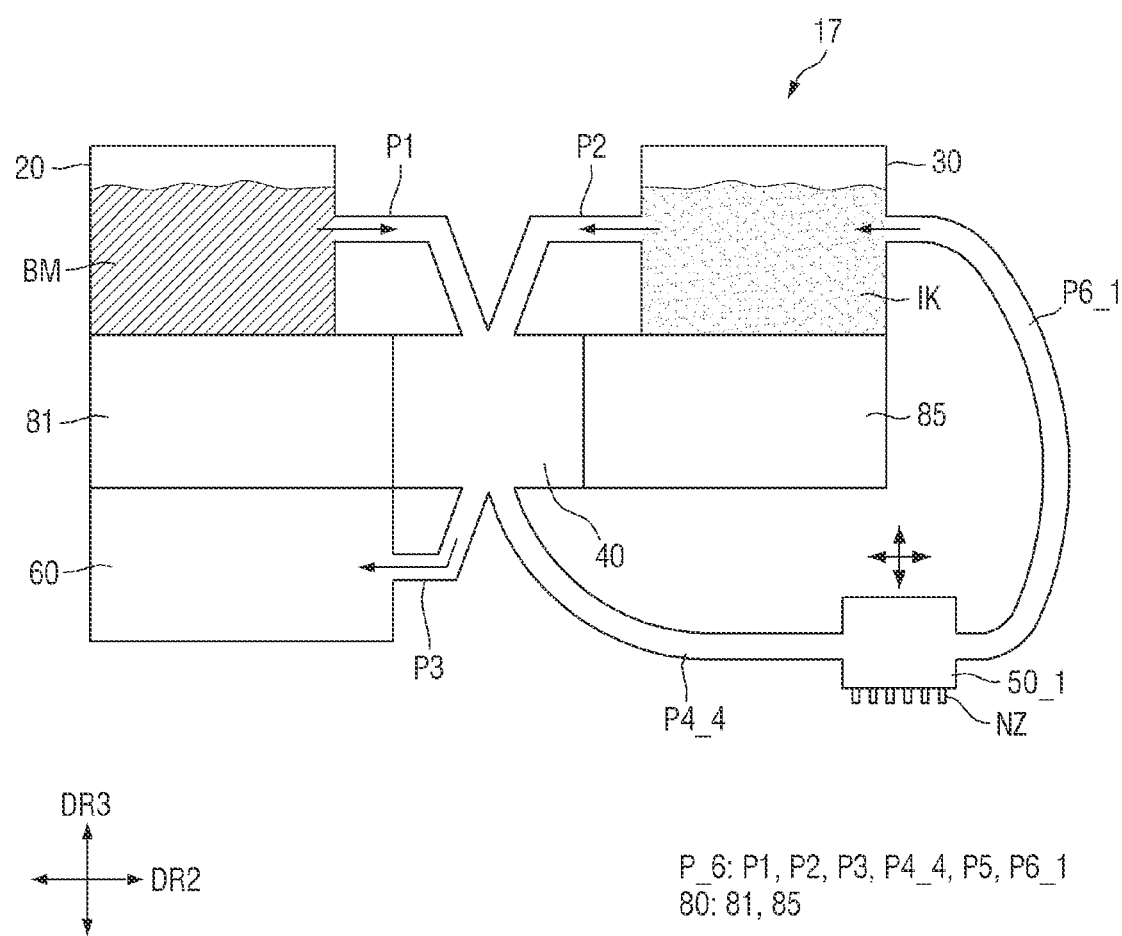
FIG. 17 is a cross-sectional view of an inkjet printing apparatus according to still another embodiment.

FIG. 17 is a cross-sectional view of an inkjet printing apparatus according to still another embodiment.

Referring to FIG. 17, an inkjet printing apparatus 17 according to this embodiment differs from the inkjet printing apparatus 10 of FIG. 2 in that an inkjet head unit 50_1 can be separated from the surface acoustic wave module 40.

In more detail, the inkjet printing apparatus 17 according to this embodiment is characterized in that the inkjet head unit 50_1 can be separated from the surface acoustic wave module 40. The inkjet head unit 50_1 may be separated from the second support member 85. According to this embodiment, all of the components 20, 30, 60, 80, P1, P2, P3, P4, and P5, with the exception of the inkjet head unit 50_1 and passages P4_4 and P6_1, may be fixed, and the inkjet head unit 50_1 and the passages P4_4 and P6_1 may be movable. The second outflow passage P_4_4 and the first connection passage P6_1 may be made of a flexible material in contrast to the fixed passages P1, P2, P3, P4, and P5.

Although embodiments of the present disclosure have been disclosed for illustrative purposes, those skilled in the art will appreciate that various modifications, additions and substitutions are possible, without departing from the scope and spirit of the present disclosure as disclosed in the accompanying claims, and equivalents thereof.

What is claimed is:

1. A method of manufacturing a display device, the method comprising:
   introducing an ink base material and ink comprising first ink particles and second ink particles into an inner passage of a surface acoustic wave module;
   separating the first ink particles having an average particle diameter equal to or greater than a first particle diameter from the second ink particles having an average particle diameter smaller than the first particle diameter based on the first particle diameter utilizing a surface acoustic wave of a surface acoustic wave generator around the inner passage; and
   spraying an ink mixture of the separated second ink particles and the ink base material onto a substrate,
   wherein the introducing the ink base material and the ink into the inner passage comprises introducing the ink base material and the ink into the inner passage through respective inflow passages.

2. The method of claim 1, wherein the separating the first ink particles and the second ink particles utilizing the surface acoustic wave comprises;
   forming the surface acoustic wave utilizing the surface acoustic wave generator, the surface acoustic wave generator being closer to the inflow passage of the ink than the inflow passage of the ink base material.

3. The method of claim 2, wherein the separating the first ink particles and the second ink particles utilizing the surface acoustic wave comprises separating the first ink particles from the second ink particles by adjusting a wavelength and an intensity of the surface acoustic wave.

4. The method of claim 3, wherein the first ink particles are separated from the second ink particles based on the first particle diameter of about 2 μm utilizing the surface acoustic wave having the wavelength of about 25 μm or less and the intensity of about 10 dBm or more.

5. The method of claim 3, wherein the first ink particles are separated from the second ink particles based on the first particle diameter of about 3 μm utilizing the surface acoustic wave having the wavelength of about 28 μm or less and the intensity of about 2.5 dBm or more.

6. The method of claim 1, wherein the ink base material comprises a base resin, and wherein the ink comprises wavelength shifters.

* * * * *